(12) United States Patent
Shue et al.

(10) Patent No.: US 6,686,280 B1
(45) Date of Patent: Feb. 3, 2004

(54) SIDEWALL COVERAGE FOR COPPER DAMASCENE FILLING

(75) Inventors: Shau-Lin Shue, Hsinchu (TW); Mei-Yun Wang, Hsin-Chu (TW); Chen-Hua Yu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 20 days.

(21) Appl. No.: 09/989,802

(22) Filed: Nov. 20, 2001

Related U.S. Application Data

(63) Continuation-in-part of application No. 09/358,983, filed on Jul. 22, 1999.

(51) Int. Cl.$^7$ ............................ H01L 21/00; H01L 21/44
(52) U.S. Cl. .................... 438/675; 204/192.12
(58) Field of Search ................ 438/675, 584; 204/192.12

(56) References Cited

U.S. PATENT DOCUMENTS

| | | |
|---|---|---|
| 5,316,974 A | 5/1994 | Crank ........................ 437/190 |
| 5,674,787 A | 10/1997 | Zhao et al. .................. 437/230 |
| 5,677,244 A | 10/1997 | Venkatraman ............... 437/198 |
| 5,814,557 A | 9/1998 | Venkatraman et al. ....... 438/622 |
| 6,177,347 B1 * | 1/2001 | Liu et al. ..................... 438/675 |
| 6,375,810 B2 * | 4/2002 | Hong ..................... 204/192.12 |
| 2002/0110999 A1 * | 8/2002 | Lu et al. ...................... 438/584 |

* cited by examiner

*Primary Examiner*—W. David Coleman
(74) *Attorney, Agent, or Firm*—George O. Saile; Stephen B. Ackerman

(57) ABSTRACT

A general process is described for filling a hole or trench at the surface of an integrated circuit without trapping voids within the filler material. A particular application is the filling of a trench with copper in order to form damascene wiring. First, a seed layer is deposited in the hole or trench by means of PVD. This is then followed by a sputter etching step which removes any overhang of this seed layer at the mouth of the trench or hole. A number of process variations are described including double etch/deposit steps, varying pressure and voltage in the same chamber to allow sputter etching and deposition to take place without breaking vacuum, and reduction of contact resistance between wiring levels by reducing via depth.

22 Claims, 5 Drawing Sheets

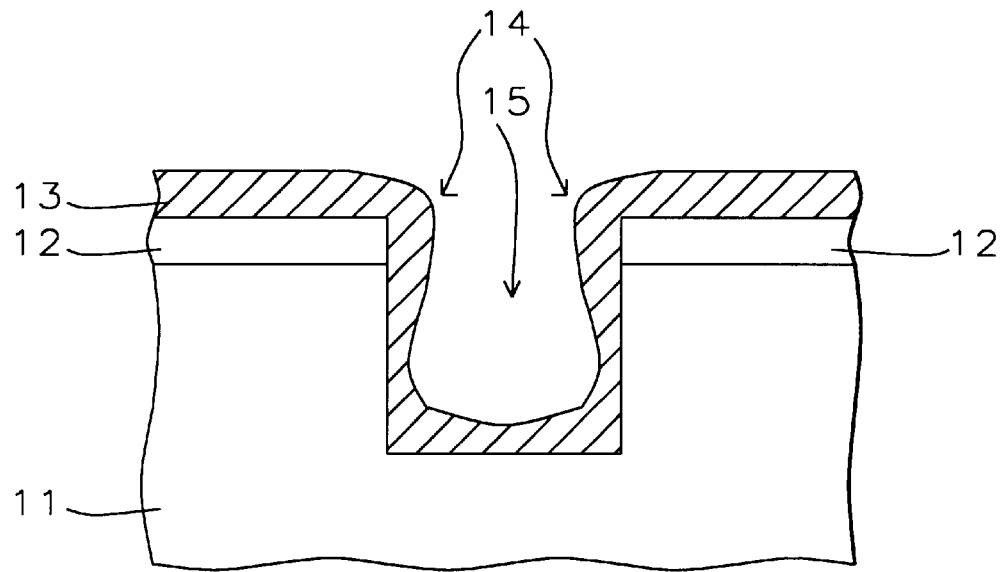
FIG. 1 – Prior Art
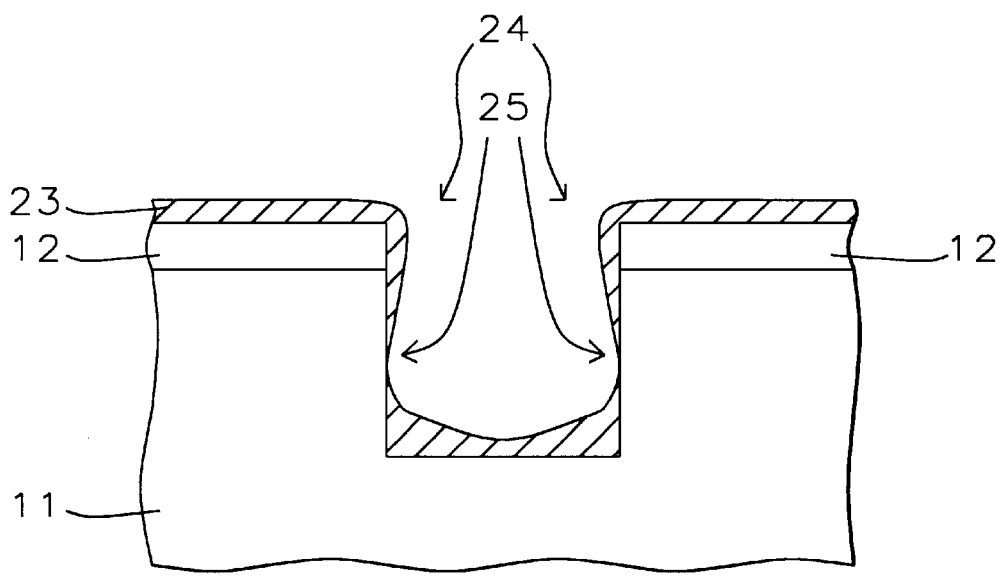
FIG. 2 – Prior Art

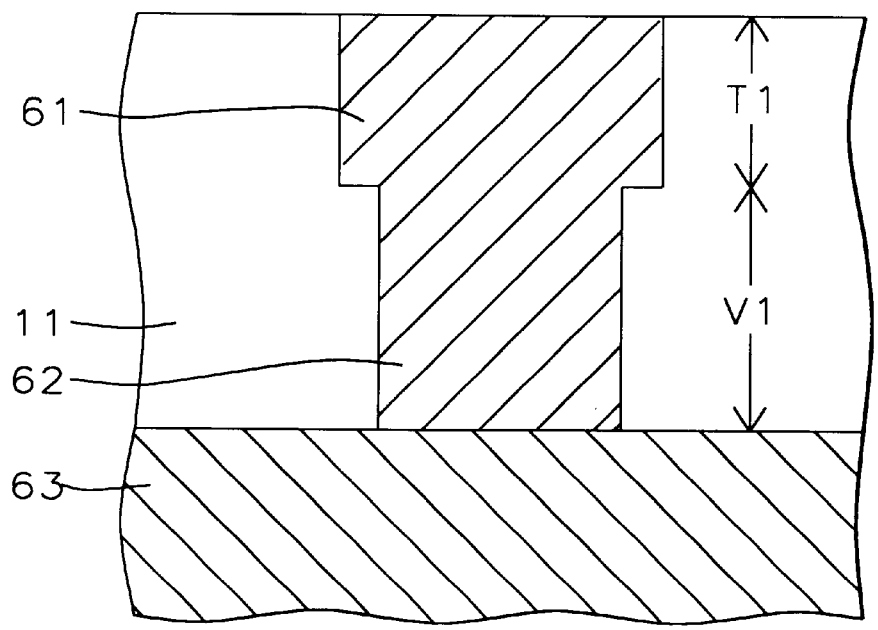
FIG. 6 − Prior Art
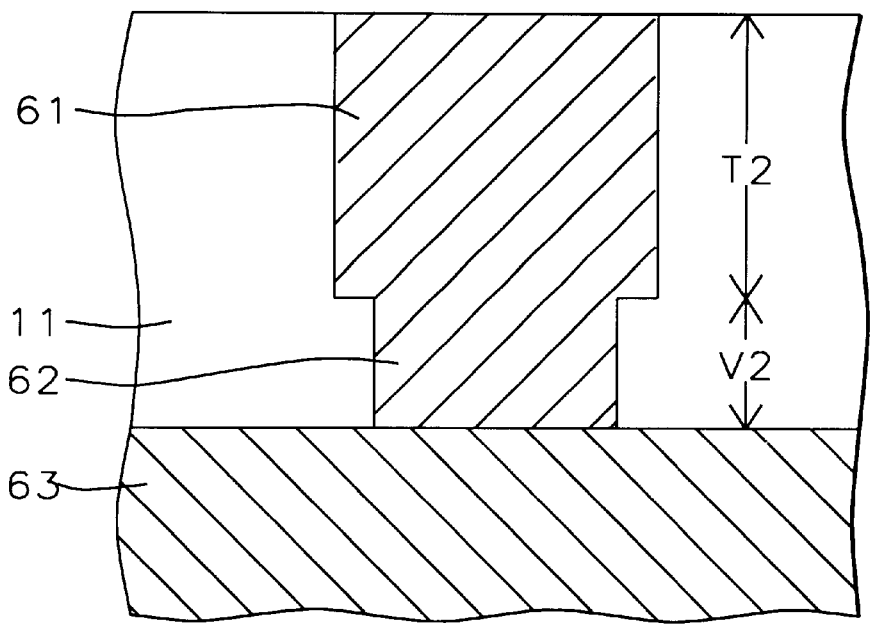
FIG. 7

SIDEWALL COVERAGE FOR COPPER DAMASCENE FILLING

Continuation in part of application Ser. No. 09/358,983 which was filed Jul. 22, 1999.

FIELD OF THE INVENTION

The invention relates to the general field of integrated circuit manufacture with particular reference to techniques for filling small opening with metal, for example copper in a damascene structure.

BACKGROUND OF THE INVENTION

During the course of manufacturing an integrated circuit, the need frequently arises to fill an opening in the form of a hole or trench (generally in the surface of a dielectric layer) with material such as tungsten or copper. A particular example of this is the well-known damascene process in which conducting lines are formed that are flush with the surface rather than lying on top of it.

We illustrate, in FIG. 1, a particular problem which arises when a hole or trench needs to be filled with copper. This problem becomes increasingly more acute as the diameter or width of the opening gets to be less than about 0.3 microns. Before the opening can be filled using a high-volume technique such as electroplating, it is necessary to lay down a seed layer of copper. In FIG. 1 we show a cross-section of a portion of dielectric (or some other material) layer 11 in which opening 15 has been formed. Layer 12 is a layer of field oxide that is normally present although not directly relevant to the practice on the present invention.

The problem mentioned above arises with the deposition of seed layer 13 (usually, but not necessarily) of copper. The most widely used processes for depositing the seed layer are vacuum evaporation and sputtering (known collectively as PVD or physical vapor deposition). Because of shadowing effects, there is a tendency for more material to build up near the mouth of the opening than lower down, giving the deposited seed layer the profile shown in FIG. 1. In particular, there can be substantial overhang of the seed layer, as pointed to by arrows 14, near the mouth of the opening.

When layer 13 is later built up, typically by electroplating, so as to fully fill opening 15, material at the edges of the overhang come together before the hole can be fully filled, resulting in the trapping of a void within the copper plug (sometimes called the key hole effect).

An obvious approach to dealing with this problem is to reduce the amount of overhang to the point that void trapping does not occur. In the prior art this is done either by limiting the amount of copper deposited in the first place or by etching the seed layer back using conventional chemical means, such as wet or dry etching.

Simply reducing the thickness of the seed layer, while reducing the possibility of void formation, introduces a new problem which is illustrated in FIG. 2. Shown there is seed layer 23, having reduced thickness relative to seed layer 13 of FIG. 1. However, if the overhang 24 is sufficiently reduced, bare spots such as 25 begin to appear on the side walls of the opening. The presence of such bare spots then has disastrous consequences for the subsequent hole filling procedure since multiple voids and poorly adherent areas get formed. The present invention shows how a seed layer having little or no overhang, while at the same time having sufficient thickness to fully cover the side walls, may be formed.

Effect on contact resistance between wiring layers

We note here that, because of the problems outlined above, it was necessary to limit trench depths so as to keep their aspect ratio (as seen in cross-section) to less than about 6:1, otherwise there was a danger of voids forming when they were filled with metal. This in turn meant that via holes extending downwards from the trench bottom to the next wiring level (i.e. dual damascene structures) had to be correspondingly deeper (i.e. their aspect ratio would typically be at least 6:1). As a result, the series resistance of the via (i.e. wiring level to wiring level contact resistance), when filled with metal, would be larger than desired. Typically, a contact resistance less than 1 ohm for a via size of 0.2 microns could occur. In FIG. 6 we show a typical dual damascene structure of the prior art in which the depth of trench 61 is T1 and the depth of via 62 is V1. It follows that any increase in the ratio T1/V1 will reduce the wire-to-wire contact resistance.

A routine search of the prior art was conducted but no references were found that teach the solution described by the present invention. Several of these references were, however, of interest. For sample, Crank (U.S. Pat. No. 5,316,974) limits the seed layer to the bottom of the trench so that the filler plug grows (by electroplating) from the bottom up and not from the vertical sides, thereby avoiding void formation.

Zhao et al. (U.S. Pat. No. 5,674,787) form the seed layer by exposing the conductor at the bottom of the hole and then dipping it in a solution that deposits a thin copper layer by displacement. A plug is then grown on this seed layer using an electroless process.

Venkatraman (U.S. Pat. No. 5,677,244) dopes aluminum with copper by first laying down an agglomerated copper film, then depositing the aluminum copper then heating so as to diffuse the copper islands throughout the aluminum.

Venkatraman et al. (U.S. Pat. No. 5,814,557) describe a process for filling the trench/hole of a damascene structure by depositing two different conductors one after the other.

SUMMARY OF THE INVENTION

It has been an object of the present invention to provide a process for filling a trench or hole at the surface of an integrated circuit without trapping voids or leaving bare spots on the side walls.

Another object of the invention has been to provide an apparatus in which to implement the process of the present invention.

A further object of the invention has been to provide a process for the formation of damascene wiring that is free of trapped voids (key hole effect).

A still further object of the invention has been that said process and apparatus be fully compatible with current techniques in use for the manufacture of semiconductor integrated circuits.

These objects have been achieved by first depositing a seed layer in the hole or trench by means of PVD, in the usual manner. This is then followed by a sputter etching step which removes any overhang of this seed layer at the mouth of the trench or hole. It is in general preferable to perform the deposition and etching of the seed layer in the same apparatus without breaking vacuum between operations. When the sputter etch conditions specified by the invention are followed all overhang by the seed layer at the mouth of the trench or hole is essentially eliminated without the introduction of any poorly adhering or bare spots on the side walls.

This technique can be further improved by several refinements including multiple, sputter etching and seed layer deposition steps, increasing the T/V ratio discussed above, and using sputtering under varying conditions of pressure and voltage both to form the seed layer as well as to flatten it.

BRIEF DESCRIPTION OF THE DRAWINGS

FIG. 1 illustrates how a seed layer, deposited for the purpose of lining a trench or hole, can exhibit considerable overhang near the mouth of the opening.

FIG. 2 illustrates how attempts of the prior art to solve this problem have led to new problems in the form of bare spots on the side walls.

FIG. 6 shows a dual damascene structure in which limitations of the prior art cause a higher than desired wire-to-wire contact resistance.

FIG. 7 is the structure of FIG. 6 with said contact resistance has been reduced.

DESCRIPTION OF THE PREFERRED EMBODIMENTS

The process of the present invention begins, as in the prior art, with the formation of an opening such as a hole or trench (such as 15 in FIG. 1) in the surface of an integrated circuit. Most commonly, said surface will be that of a dielectric layer, but that is not a requirement of the invention. Typically the trench width used will be between about 0.1 and 15 microns, the hole diameter between about 0.1 and 0.5 microns, and the depth of the opening will be between about 0.4 and 1 microns.

Next, if a copper damascene process is being used, a barrier layer of a material such as tantalum, tantalum nitride, titanium nitride, or tungsten nitride is laid down to a thickness between about 100 and 500 Angstroms. Whether or not a barrier layer is used, a seed layer of metal (specifically copper if a damascene process is being used) is next laid down to cover the inside surfaces of the trench or hole. The thickness of this seed layer is between about 800 and 2,500 Angstroms and it is deposited by means of PVD (sputtering or vacuum evaporation).

Once the seed layer is in place, a process step not currently practiced in the prior art is introduced. This is the removal of a certain amount of the seed layer (typically between about 100 and 500 Angstroms) by means of sputter etching. This latter step is performed using argon at a pressure between about 0.1 and 2 mtorr, at a power level between about 150 and 450 watts. Sputter etching may be effected by using either DC or RF.

Because of shadowing effects, material from the seed layer is preferentially removed from the overhanging portion at the mouth of the trench or hole. For best results, it is important that the sputtering conditions specified above are used. Selective removal of the overhang will not be achieved if, for example, the pressure used for sputter etching is too high.

Figure 3A:
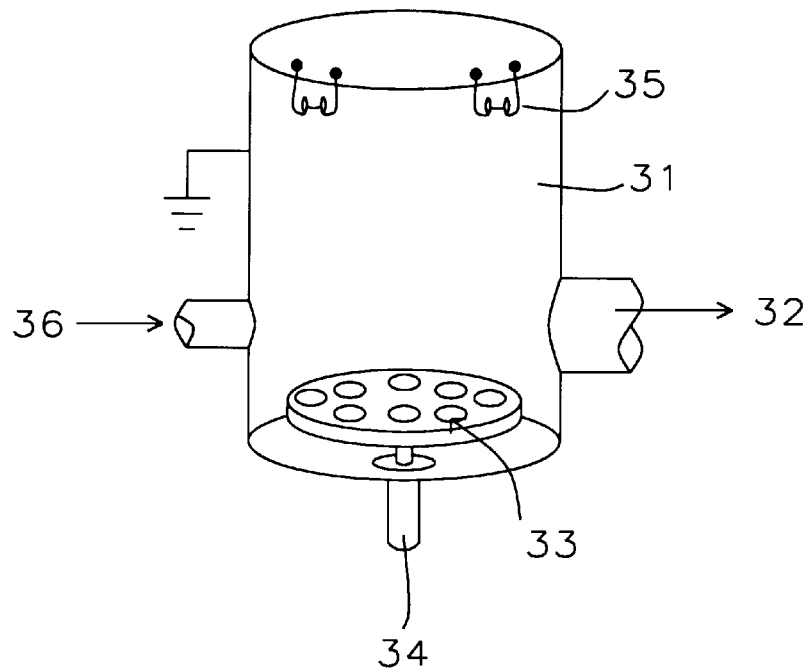
FIGS. 3a and 3b show two embodiments of the apparatus used for implementing the present invention.

While the invention will still be effective if the PVD and sputter etching steps are performed in separate chambers we have preferred to use a single chamber for both of these processes because of the resulting improved throughput. An example of the apparatus in which this in-situ deposition and etching are performed is shown in FIG. 3a. Evacuable chamber 31 is provided with a pumping port 32 as well as adjustable inlet 36 for the controlled admission of a sputtering gas (generally, but not necessarily, argon). In the example shown in FIG. 3a, the filler material (copper if a damascene process is being used) is deposited in a downwards direction from a suitable source such as tungsten filament 35. To ensure good coverage by the deposited metal, a plurality of such sources, typically arranged in a ring, are often used. An electrode 33, having a flat horizontal surface and located near the bottom of the chamber, is used to support the integrated circuit wafer(s) during metal deposition and also serves as the electrode to which power for the sputter etching (symbolized as 34 in the figure) is delivered. Since the wafers are supported from below, it is not required that they be clamped to the electrode.

Figure 3B:
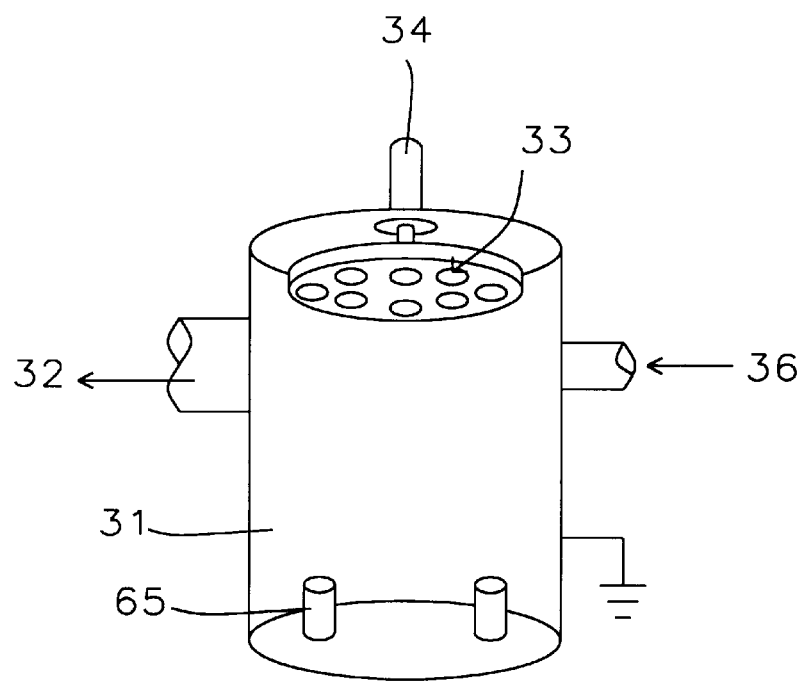

In an alternative embodiment of the apparatus, the arrangement shown in FIG. 3b was used. Evacuable chamber 31 is provided with a pumping port 32 as well as adjustable inlet 36 for the controlled admission of a sputtering gas (generally, but not necessarily, argon). In the example shown in FIG. 3b, the filler material (copper if a damascene process is being used) is deposited in an upwards direction from a suitable source such as crucible 65. To ensure good coverage by the deposited metal, a plurality of such sources, typically arranged in a ring, are often used. An electrode 33, having a flat horizontal surface and located near the top of the chamber, is used to support the integrated circuit wafer(s) during metal deposition and also serves as the electrode to which power for the sputter etching (symbolized as 34 in the figure) is delivered. In this embodiment, it is necessary to clamp the wafers to the electrode.

Figure 4:
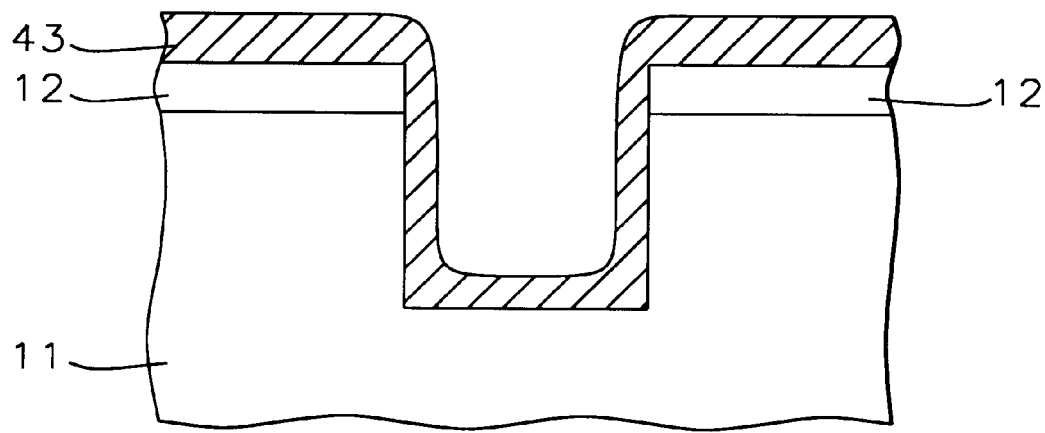
FIG. 4 shows how the profile of a seed layer can exhibit little or no overhang after processing according to the present invention

Regardless of the exact manner in which layer 13 (FIG. 1) was deposited, the introduction of the extra sputter etching step (assuming the conditions that we have specified are followed) has the effect of preferentially removing metal from the overhang, resulting in the seed layer profile shown in FIG. 4. As can be seen, seed layer 43 now has an outer surface that closely parallels the contours of the original trench or hole. When this is the case, the opening may be filled, using a deposition technique such as electroplating, and then over-filled, giving it the profile shown in FIG. 5, where layer 53 represents the filler layer. Note that no voids have been trapped within 53 and that no bare spots are present at the trench walls.

Figure 5:
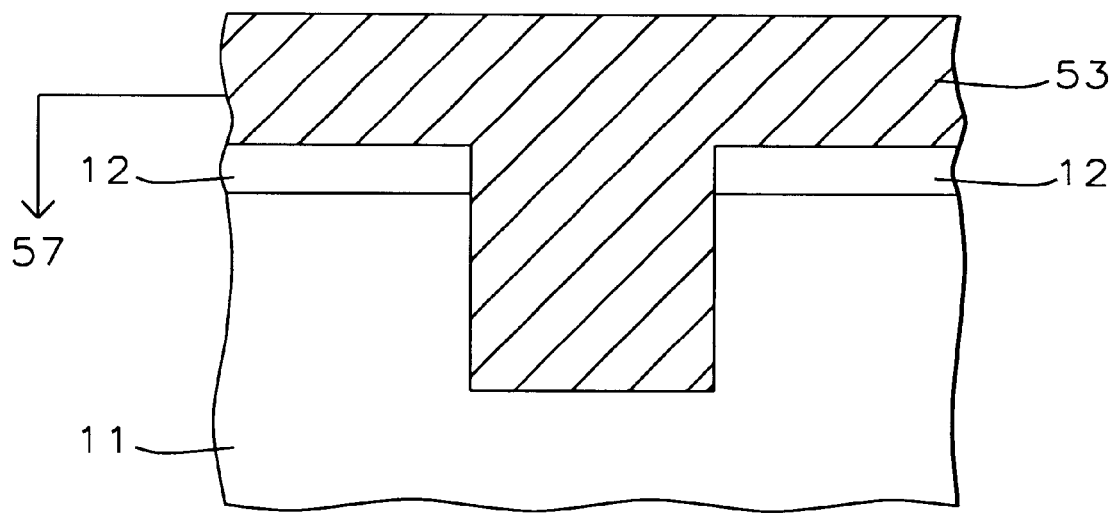
FIG. 5 illustrates how a hole or trench may be over filled without trapping of any voids.

Once the structure shown in FIG. 5 has been obtained, formation of the damascene structure may be completed by planarizing the surface of 53. Of several available techniques CMP (chemical mechanical polishing) is the most widely used for this purpose.

Additional Process Refinements

The basic process described above may be further improved by the addition of several refinements:

(1) After most of the overhang by the seed layer at the mouth of a cavity has been removed, as described above, a second seed layer deposition is undertaken followed by a second sputter etching step. These additional steps further improve the profile of the seed layer at the mouth of the cavity. Typically, the initial (first) thickness of the seed layer would be between about 800 and 2,500 Angstroms. The amount of seed layer removed during the first sputter etching step would be between about 400 and 1,000 Angstroms while the amount of seed layer removed during the second sputter etching step would be between about 400 and 1,000 Angstroms.

(2) By taking advantage of the fact that deeper cavities can now be properly filled, it becomes possible to increase the depth of the trench portion of a dual damascene structure which allows for a reduction in the depth of the via portion. This, in turn, reduces wire-to-wire contact resistance to values as low as about 0.5 ohms for an 0.2 micron via, as illustrated in FIG. 7 where the ratio T2/V2 is seen to have been increased relative to T1/V1 in FIG. 6.

Figure 8:
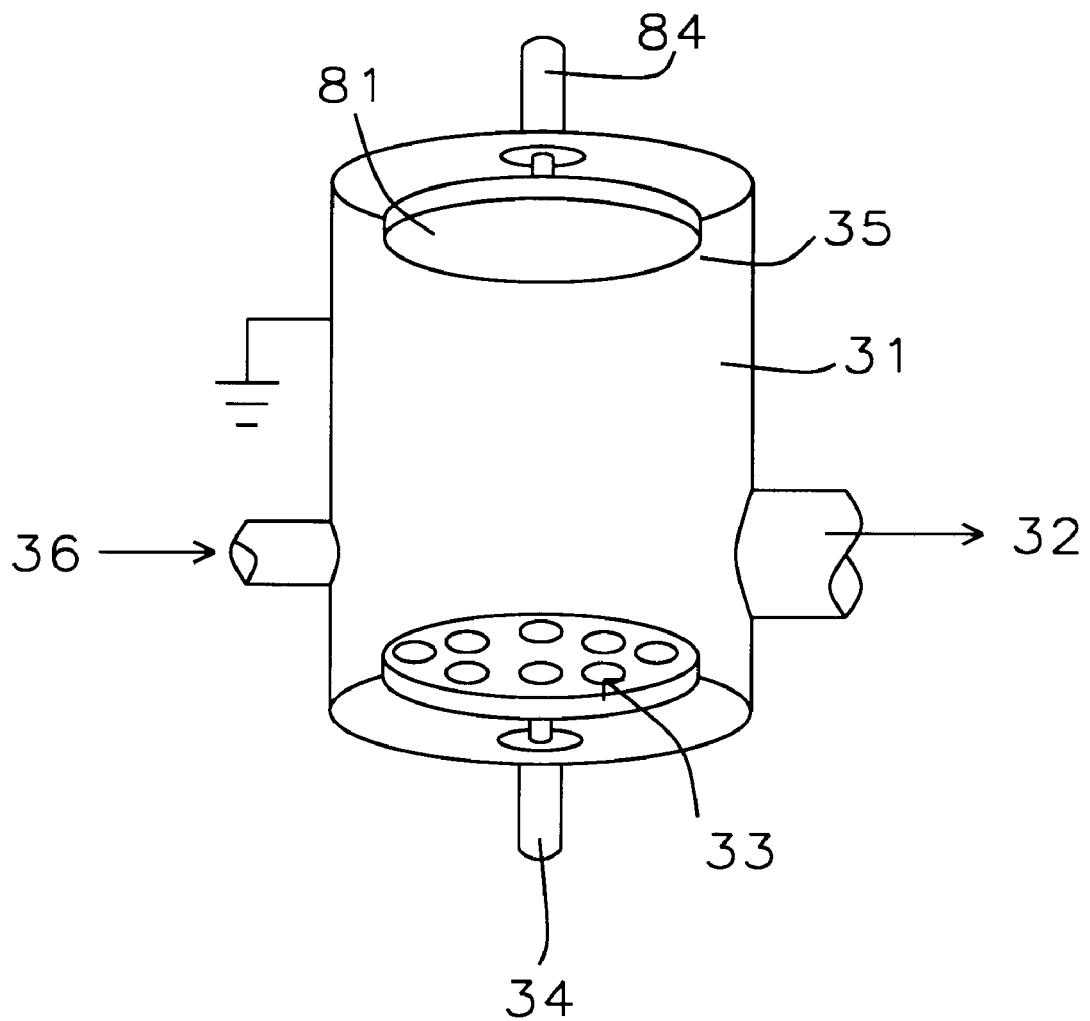
FIG. 8 illustrates an apparatus in which sputtering may be used to both deposit and etch a seed layer.

(3) By arranging to use a single chamber, as illustrated in FIG. 8, for both the deposition and the sputter etching of the seed layer, a cleaner process can be achieved since there is need for only a single pump down.

(4) As a further refinement of process (3), the pressure of the sputtering gas (usually argon) is arranged to be relatively high (between about 0.01 and 100 mtorr) during the deposition step and then, at the same time that the voltage application point and magnitude (and hence the power) are changed, the pressure is arranged to be relatively low.

(5) In what is partly a reversal of (4) above, a sufficient amount of the seed layer is removed to ensure that no overhang remains, following which the amount removed (typically between about 400 and 1,000 Angstroms) is replaced through sputter deposition. By using a relatively high pressure for the latter step (between about 10 and 90 mtorr), the non re-appearance of the overhang is ensured.

While the invention has been particularly shown and described with reference to the preferred embodiments thereof, it will be understood by those skilled in the art that various changes in form and details may be made without departing from the spirit and scope of the invention.

What is claimed is:

1. A process for filling an opening, comprising:
    providing an integrated circuit having an upper surface;
    removing a portion of said upper surface to a depth, thereby forming an opening having a bottom surface, a mouth, and side walls;
    depositing a first seed layer of metal to a first thickness to coat the integrated circuit upper surface, the bottom surface, and the side walls of the opening;
    sputter etching said first seed layer, to reduce its thickness by a first amount, thereby preferentially removing some overhanging material present at the mouth of the opening;
    depositing a second seed layer over said first seed layer;
    sputter etching said second seed layer to reduce its thickness by a second amount, thereby preferentially removing any remaining overhanging material present at the mouth of the opening; and
    depositing additional metal, whereby said opening becomes completely filled with void free metal.

2. The process described in claim 1 wherein said first thickness is between about 800 and 2,500 Angstroms.

3. The process described in claim 1 wherein said first amount by which thickness is reduced is between about 400 and 1,000 Angstroms.

4. The process described in claim 1 wherein said second amount by which thickness is reduced is between about 400 and 1,000 Angstroms.

5. A damascene process resulting in improved side wall coverage, comprising:
    providing a dielectric layer, having an upper surface, on an integrated circuit;
    patterning and etching said dielectric layer, thereby forming a trench having a bottom surface, a mouth, and side walls;
    depositing a first seed layer of copper to a first thickness to coat said upper surface, said bottom surface, and said side walls;
    sputter etching said first seed layer, to reduce its thickness by a first amount, thereby preferentially removing some overhanging material present at the mouth of the trench;
    depositing a second seed layer on said first seed layer;
    sputter etching said second seed layer to reduce its thickness by a second amount, thereby preferentially removing any remaining overhanging material present at the mouth of the trench;
    depositing additional copper to form a filler layer that overfills the trench; and
    planarizing said filler layer, thereby just filling the trench with copper and removing any copper that is outside the trench.

6. The process described in claim 5 wherein said first thickness is between about 800 and 2,500 Angstroms.

7. The process described in claim 5 wherein said first amount by which thickness is reduced is between about 400 and 1,000 Angstroms.

8. The process described in claim 5 wherein said second amount by which thickness is reduced is between about 400 and 1,000 Angstroms.

9. A damascene process resulting in improved side wall coverage, comprising:
    providing a power supply having high and low voltage settings;
    providing a dielectric layer, having an upper surface, on an integrated circuit;
    patterning and etching said dielectric layer, thereby forming a trench having a bottom surface, a mouth, and side walls;
    placing said integrated circuit in a sputtering chamber;
    in said sputtering chamber, by connecting a copper target to said power supply, set to high voltage and power, sputter depositing a seed layer of copper to coat said upper surface, said bottom surface, and the side walls of the trench;
    then, in said sputtering chamber, by connecting said integrated circuit to said power supply set to low voltage, sputter etching the seed layer to reduce its thickness by an amount, thereby preferentially removing any overhang present at the mouth of the trench;
    depositing additional copper to form a filler layer that overfills the trench; and
    planarizing said filler layer, thereby just filling the trench with copper and removing any copper that is outside the trench.

10. The process described in claim 9 wherein said power is between about 1 KW and 50 KW.

11. A process for filling an opening, comprising:
    providing a power supply having high and low voltage settings;
    providing an integrated circuit having an upper surface;
    removing a portion of said upper surface to a depth, thereby forming an opening having a bottom surface, a mouth, and side walls;

placing said integrated circuit in a sputtering chamber;

at a first sputtering gas pressure between about 0.1 and 10 mtorr in said sputtering chamber, by connecting a metal target to said power supply set to high voltage and power, sputter depositing a seed layer of metal to coat the integrated circuit upper surface, the bottom surface, and the side walls of the opening;

then, at a second sputtering gas pressure between about 10 and 90 mtorr, in said sputtering chamber, by connecting said integrated circuit to said power supply set to low voltage, sputter etching the seed layer, to reduce its thickness by an amount, thereby preferentially removing any overhang present at the mouth of the opening; and depositing additional metal, whereby said opening becomes completely filled with void free metal.

12. The process described in claim 11 wherein said sputtering gas is argon.

13. The process described in claim 11 wherein said amount that thickness is reduced is between about 400 and 1,000 Angstroms.

14. A damascene process resulting in improved side wall coverage, comprising:

providing a power supply having high and low voltage settings;

providing a dielectric layer, having an upper surface, on an integrated circuit;

patterning and etching said dielectric layer, thereby forming a trench having a bottom surface, a mouth, and side walls;

placing said integrated circuit in a sputtering chamber;

at a first sputtering gas pressure between about 0.1 and 10 mtorr in said sputtering chamber, by connecting a copper target to said power supply set to high voltage and power, sputter depositing a seed layer of copper to coat said upper surface, the bottom surface, and the side walls of the trench;

then, at a second sputtering gas pressure between about 10 and 90 mtorr, in said sputtering chamber, by connecting said integrated circuit to said power supply set to low voltage and power, sputter etching the seed layer, to reduce its thickness by an amount, thereby preferentially removing any overhang present at the mouth of the opening; and depositing additional copper to form a filler layer that overfills the trench; and planarizing said filler layer, thereby just filling the trench with copper and removing any copper that is outside the trench.

15. The process described in claim 14 wherein said sputtering gas is argon.

16. The process described in claim 14 wherein said amount that thickness is reduced is between about 400 and 1,000 Angstroms.

17. A process for filling an opening, comprising:

providing an integrated circuit having an upper surface;

removing a portion of said upper surface to a depth, thereby forming an opening having a bottom surface, a mouth, and side walls;

by means of PVD, depositing a seed layer of metal to coat the integrated circuit upper surface, the bottom surface, and the side walls of the opening;

at a first pressure between about 0.1 and 10 mtorr, sputter etching the seed layer, to reduce its thickness by an amount, thereby preferentially removing any overhang present at the mouth of the opening;

at a second pressure between about 10 and 90 mtorr, re-depositing said seed layer by means of sputter deposition, thereby replacing said amount removed without re-introducing said overhang; and depositing additional metal, whereby said opening becomes completely filled with void free metal.

18. The process described in claim 17 wherein argon is used to implement said steps of sputter etching and sputter deposition.

19. The process described in claim 17 wherein said amount that thickness is reduced is between about 400 and 1,000 Angstroms.

20. A damascene process resulting in improved side wall coverage, comprising:

providing a dielectric layer on an integrated circuit;

patterning and etching said dielectric layer, thereby forming a trench having a bottom surface, a mouth, and side walls;

by means of PVD, depositing a seed layer of copper to coat the dielectric layer, said bottom surface, and said side walls;

at a first pressure between about 0.1 and 10 mtorr, sputter etching the seed layer, to reduce its thickness by an amount, thereby preferentially removing any overhang present at the mouth of the opening;

at a second pressure between about 10 and 90 mtorr, re-depositing said seed layer by means of sputter deposition, thereby replacing said amount removed without re-introducing said overhang;

depositing additional copper to form a filler layer that overfills the trench; and planarizing said filler layer, thereby just filling the trench with copper and removing any copper that is outside the trench.

21. The process described in claim 20 wherein argon is used to implement said steps of sputter etching and sputter deposition.

22. The process described in claim 20 wherein said amount that thickness is reduced is between about 400 and 1,000 Angstroms.

* * * * *